US006234658B1

(12) United States Patent
Houldsworth (10) Patent No.: US 6,234,658 B1
(45) Date of Patent: *May 22, 2001

(54) METHOD AND APPARATUS FOR PRODUCING SIGNAL PROCESSING CIRCUITS IN THE DELTA SIGMA DOMAIN

(75) Inventor: John Houldsworth, Reston, VA (US)

(73) Assignee: Duality Semiconductor, Inc., Vienna, VA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/660,361

(22) Filed: Jun. 7, 1996

(51) Int. Cl.[7] .................................................. H03M 7/32

(52) U.S. Cl. .................. 364/489; 341/77; 716/4

(58) Field of Search .................... 364/489, 490, 364/491; 341/118

(56) References Cited

U.S. PATENT DOCUMENTS

| 5,222,084 | * | 6/1993 | Takahashi | 370/32.1 |
| 5,408,235 | * | 4/1995 | Doyle et al. | 431/143 |
| 5,461,641 | * | 10/1995 | Abbiate et al. | 375/243 |
| 5,632,272 | * | 5/1997 | Diab et al. | 128/633 |

OTHER PUBLICATIONS

Gabor Citemes, "Delta Sigma Converters", Design of Analog–Digital Circuits For Telecommunications and Signal Processing, Prentice Hall, 1994, pp. 317–339.*

"Principles of Sigma–Delta Modulation for Analog-to--Digital Converters" available from Motorola, Inc., pp. 1–40, 1990.

"An Overview of Sigma–Delta–Converters" by Pervez M. Aziz et al (IEEE Signal Processing Magazine, Jan. 1996), pp. 61–84.

"Sigma–Delta Signal Processing" by Victor de Fonte Dias, IEEE International Symposium on Circuits and Systems, vol. 5, 1994, pp. 421–424.

"Realization and Implementation of a Sigma–Delta Bitstream FIR Filter" by Simon Kershaw et al, dated Dec. 1995, pp. 1–27.

(List continued on next page.)

*Primary Examiner*—Mathew Smith
*Assistant Examiner*—Thuan Do
(74) *Attorney, Agent, or Firm*—Hunton & Williams (57) ABSTRACT

The present invention is directed to providing a generalized system and method for enabling circuit design and fabrication in the delta sigma domain. In accordance with exemplary embodiments, a framework for such a system is based on a library of generalized operators that can receive multiple inputs, and that can be randomly chained together. Further, the operators are specifically configured to guarantee valid (e.g., bounded and/or stable) results, and to provide closure within the delta sigma domain; that is, to produce valid intermediate results in the delta sigma domain. Linear operators are configured to provide closure by complying with at least two criteria: (1) with respect to linear operators, at least one of (a) the inputs and (b) the output of a portion of the operator used to implement a mathematical function is scaled (e.g., normalized) to guarantee valid results; and (2) outputs from each mathematical operation are remodulated into a single bit stream in the delta sigma domain. Further, nonlinear operators such as multiplication operators, are configured with an eye toward producing valid results in the delta sigma domain. For example, with respect to nonlinear operators such as multipliers, at least one operand is restricted to being a non-delta sigma input (i.e., quantization noise-free). As with linear operators, the outputs from portions of nonlinear operators used to implement mathematical operations are remodulated to a single bit stream in the delta sigma domain.

23 Claims, 7 Drawing Sheets

OTHER PUBLICATIONS

"Digital Signal Processing on a Sigma–Delta Bitstream" (undated) by Simon Kershaw et al.

"SystemView®" by Elanix, Inc. (brochure only) (undated), 8 pages.

"Galileo Logic Explorer®" of Exemplar Logic Inc. (brochure) (undated), 4 pages.

"Electronic Communication Systems", second edition, by George Kennedy, McGraw–Hill Book Company, Gregg Division, Chapter 6, "Single–Sideband Techniques", pp. 126–148, (undated).

Database printout re: U.S. Patent No. 5,428,749; U.S. Patent No. 5,287,511; U.S. Patent No. 5,263,143 (10 pages).

* cited by examiner

METHOD AND APPARATUS FOR PRODUCING SIGNAL PROCESSING CIRCUITS IN THE DELTA SIGMA DOMAIN

BACKGROUND OF THE INVENTION

1. Field of the Invention

The present invention relates generally to the design and fabrication of signal processing circuits. More particularly, the present invention relates to the development of a library of operators, along with a system and method for using the operators, to design and fabricate customized integrated circuits which implement digital signal processing in a delta sigma domain.

2. State of the Art

General Signal Processing

Those skilled in the art will appreciate that signal processing can be performed in an analog domain (analog signal processing) or in a sampled domain (digital signal processing). In the analog domain, signals are infinitely variable, while in the digital domain signal variations occur in discrete intervals, both in time and amplitude with the length of the intervals, being a function of the desired granularity.

Although analog signal processing is performed on input signals in their native domain, it is difficult to implement analog circuit components with high precision. That is, analog signal processing circuits involve the use of components which cannot be precisely matched. Further, analog circuits are susceptible to signal drift and to environmental noise. These circuits therefore require substantial overhead (e.g., filtering) to maintain signal integrity. Despite these drawbacks, analog signal processing is still used where, for example, real time processing is required.

For applications where the signal processing delays of digital signal processors can be tolerated, digital signal processing is used because of its non-susceptibility to drift and the influences of environmental noise, and because of its ability to provide high precision results. With conventional multibit digital signal processing, a multibit sample of an analog signal is obtained at each of a plurality of the discrete sampling instances. Each multibit value approximates the level which the analog signal possesses at that time.

One multibit technique for converting an analog signal into a sampled signal is known in the art as pulse code modulation (PCM). Here, a multibit binary number is used to represent the magnitude of the analog signal at each sampled interval. However, high resolution PCM digital signal processing can only be achieved with high circuit complexity and with relatively slow sequential digital processing.

Digital signal processing (DSP) systems such as PCM systems typically operate on an analog signal by using an analog-to-digital converter to produce the multibit values as an approximation of the analog signal. That is, the multibit levels constitute an approximation of magnitudes of the analog signal at discrete points in time. Any differences between the original analog signal and the sampled signal can be considered quantization noise which has been added to the signal (that is, quantization error).

PCM processing is performed by taking Nyquist sampling into account (i.e., sampling is performed at a minimum of twice the highest frequency of the analog signal) to ensure that the original analog signal can be reconstructed. When sampling at the Nyquist frequency, the quantization noise can only occupy space in the frequency domain at which the original signal exists. In the frequency domain, noise from the quantizer spreads from DC to one-half of the Nyquist rate as described, for example, in a document entitled "Principles of Sigma-Delta Modulation for Analog-to-Digital Converters" available from Motorola, Inc. (see, for example, page 8). However, because the band, within which the quantization noise is spread, corresponds to the band from which the original analog signal is to be retrieved, it is difficult to distinguish and retrieve the original signal. Because the number of levels of the analog-to-digital converter is proportional to the precision or accuracy with which the signal can be represented, such converters tend to be complex and expensive. Further, conventional digital signal processors may be inappropriate for real time applications since they are based on relatively slow sequential signal processing and the use of a centralized digital signal processor.

More recently, a delta sigma (also referred to as a "sigma delta") approach has been used to implement analog-to-digital conversion. With a typical delta sigma converters, rather than going directly to a multilevel representation of an analog signal, an intermediate stage is used to implement oversampling. Such oversampling is performed at a rate much higher than the necessary Nyquist frequency, but with a reduced number of quantization levels.

The oversampling of a delta sigma approach spreads the quantization noise over the band from DC up to one-half of the oversample rate (which is relatively high in comparison to the Nyquist frequency). Because oversampling is performed at a relatively high frequency, the quantization noise is now spread over a band which extends to a limit much higher than the signal band of interest. Therefore, the amount of noise in the signal band of interest is reduced. Such a configuration permits a (digital) filter to easily separate the signal of interest, and is widely used for high resolution analog-to-digital converters. Conventional analog-to-digital converters typically include a digital decimation filter that subsequently passes the signal band and rejects the noise, thereby providing a multibit word output at the Nyquist rate (i.e., a rate sufficient to fully represent the analog signal).

A similar reverse technique can be used to provide digital-to-analog conversion. After further processing with multibit digital signal processing components, the output from the digital signal processor can be converted back to an analog signal by using a filter to interpolate between the Nyquist samples. The resultant signal which is now smooth is resampled at a much higher rate, adding quantization noise to produce a bit stream. This bit stream is then supplied to a continuous time analog filter to reconstruct the original analog signal.

The reduction of noise in the signal band of interest can be more significantly reduced by including the quantizer in a closed loop. A filter can be included in the loop to shape the quantization noise. If the forward gain of the path has high DC gain, it suppresses the quantization noise at the lower frequencies.

Having explained noise shaping with respect to a first order modulator wherein noise rises proportional to frequency, it will be appreciated that different order modulators can be used to adjust the noise shape. Higher order filters decrease the portion of the quantization noise present in a signal band of interest.

For example, with a second order modulator, for every doubling of the oversample ratio (the ratio of the oversample rate to the Nyquist frequency), 2.5 bits of enhanced resolution can be achieved. Thus, even if a single threshold quantizer which only gives a one bit result is used, oversampling at 1000 times greater than the Nyquist rate results in ten doublings and produces 25 bits of available resolution. The residual noise in the signal band would be represented by only one of the 25 bits or one part in 32 million. A document entitled "An Overview of Sigma-Delta-Converters" by Pervez M. Aziz et al (IEEE Signal Processing Magazine, January 1996), page 82, compares different resolutions achieved with different delta sigma modulators.

In sum, delta sigma modulation has been used as an intermediate step to producing multibit (PCM) digital signal processing, wherein the quantization noise of a bit stream is spread across a frequency band greater than the signal band of interest. However, because the delta sigma modulation is merely used as an intermediate step to multibit processing, the signal processing delays and the circuit complexities which result when changing from the filtering word lengths in the multibit domain are incurred.

Delta Sigma Processing

More recently, it has been realized that delta sigma signals can be processed in the bit stream domain, without conversion to a multibit (e.g., PCM) signal. Such processing is possible because the density of ones or zeros at any given point in the bit stream represents the analog information to be conveyed. Thus, a single wire can be used to convey all of the analog signal information.

For example, a document entitled "Sigma-Delta Signal Processing" by Victor de Fonte Dias, IEEE International Symposium on Circuits and Systems, Volume 5, 1994, pages 421–424 describes the conceptual use of operators for processing analog signals as bit streams in the delta sigma domain. One operator described in the Dias document is an adder for summing two bit streams in the delta sigma domain. Afterwards, the resultant signal is supplied to a remodulator to maintain the output in the delta sigma domain. Thus, this document reflects recognition that operations such as addition can be performed on the bit stream in the delta sigma domain.

However, one drawback of the adder described in the Dias document is that it is not a general purpose operator. That is, if the two inputs exceed one half of the available range of possible input signal values, the remodulator will saturate. Further, there is no description of a generalized approach to providing operators for processing signals in the delta sigma domain in a manner which scales inputs to ensure that valid, bounded intermediate processing results will be obtained. Because no such generalized approach is disclosed, the operators cannot be randomly chained together to implement complex processing functions in the delta sigma domain.

Another example of signal processing in the delta sigma domain is described in a document entitled "Realization and Implementation of a Sigma-Delta Bitstream FIR Filter" by Simon Kershaw et al, dated December 1995, pages 1–27, wherein single-input signal processing for filtering signals is disclosed. This document indicates that the overhead associated with analog-to-digital conversion, and with the digital-to-analog conversion in conventional multibit digital signal processors is relatively high. The Kershaw document therefore describes operating in the delta sigma domain to reduce this overhead. However, the Kershaw document only operates on a single input signal, and permits multibit values to occur during the intermediate signal processing. Conversion back to the delta sigma domain occurs only after all of the lumped PCM processing has been completed. That is, a lumped multibit-PCM processor is included in the circuit, such that generalized operators which operate on multiple inputs and which function entirely within the delta sigma domain are not disclosed. Consequently, drawbacks similar to those associated with the conventional use of delta sigma processing as an intermediate step to multibit processing are incurred (e.g., increased circuit complexity as word lengths grow in the multibit processing portion of the circuit).

Another Kershaw et al document entitled "Digital Signal Processing on a Sigma-Delta Bitstream" (undated) also describes signal processing of a single input in the delta sigma domain. However, like the aforementioned Kershaw et al document, this Kershaw et al document fails to describe a generalized approach which is amenable to simplified circuit design and fabrication for processing multiple inputs in the delta sigma domain.

Recognizing that multibit digital processing is unsuitable for all applications (such as real time applications), and recognizing the drawbacks of analog signal processing (e.g., susceptibility to drift, noise and the difficulty in matching components), it would be desirable to design and fabricate circuits in the delta sigma domain. However, at present, there is no generalized system or method available for accommodating the design and fabrication of circuits in the delta sigma domain in a manner which ensures that valid results are obtained from each phase of signal processing, and in a manner which ensures that intermediate results are maintained in the delta sigma domain.

SUMMARY OF THE INVENTION

The present invention is directed to providing a generalized system and method for enabling circuit design and fabrication in the delta sigma domain. In accordance with exemplary embodiments, a framework for such a system is based on a library of generalized operators that can receive multiple inputs, and that can be randomly chained together. Further, the operators are specifically configured to guarantee valid (e.g., bounded and/or stable) results, and to provide closure within the delta sigma domain; that is, to produce valid intermediate results in the delta sigma domain. Linear operators are configured to provide closure by complying with at least two criteria: (1) with respect to linear operators, at least one of (a) the inputs and (b) the output of a portion of the operator used to implement a mathematical function is scaled (e.g., normalized) to guarantee valid results; and (2) outputs from each mathematical operation are remodulated into a single bit stream in the delta sigma domain. Further, nonlinear operators such as multiplication operators, are configured with an eye toward producing valid results in the delta sigma domain. For example, with respect to nonlinear operators such as multipliers, at least one operand is restricted to being a non-delta sigma input (i.e., quantization noise-free). As with linear operators, the outputs from portions of nonlinear operators used to implement mathematical operations are remodulated to a single bit stream in the delta sigma domain.

Having established a generalized library of operators as a framework, exemplary embodiments of the present invention are further directed to a system and method for using the library to design and fabricate circuits in the delta sigma domain. Exemplary embodiments exploit the availability of existing design and fabrication tools to initially capture a behavioral model of an analog circuit using ideal analog operators. In accordance with exemplary embodiments of the present invention, these ideal analog operators are used to generate an "analog" netlist which is then translated into a "logic" netlist using the generalized library of delta sigma operators. For this purpose, the delta sigma operators are configured to correspond one for one with the ideal analog operators. Once the analog operators have been translated into logic using the delta sigma operators, the logic circuit design can be routed and fabricated using available routing and fabrication tools.

Exemplary embodiments of the present invention provide significant advantages. For example, because a generalized library of delta sigma operators is used, the operators can be randomly chained together to implement any analog circuit which has been configured using the analog capture tool. Thus, the benefits of processing input signals in the analog domain can be preserved (e.g., high speed processing for real time applications), along with the benefits of digital signal processing (e.g., immunity to drift and noise). Further, the overall design process can be significantly simplified, since a block analog diagram, which is readily familiar to the circuit designer, can be directly translated into a set of operators in the delta sigma domain. Because exemplary embodiments can use existing circuit design and fabrication tools, the circuit designer needs no special understanding of delta sigma processing. Rather, a behavioral model of a circuit can be designed and simulated in the analog domain, and then be automatically translated into the delta sigma domain for fast, cost-effective implementation as a logic array in any target logic device (e.g., field programmable gate array, application specific integrated circuit and so forth).

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

Exemplary embodiments of the present invention can be used to significantly improve the implementation of solutions to any of a variety of signal processing problems. For example, one such signal processing problem relates to adding the left and right signals of an audio stereo signal. Solutions to this problem are typically implemented in the multibit digital domain by adding two multibit values. In contrast, using the delta sigma domain in accordance with the present invention, each channel of the stereo is represented as a bit stream that includes the analog signal of that channel plus the quantization noise due to sampling the signal. Therefore, mathematical operations (e.g., any logical and/or arithmetic operation) can be performed on the two signals as if they were analog signals.

To implement digital signal processing in the delta sigma domain without suffering the drawbacks of the prior art, exemplary embodiments are directed to creating a generalized library of operators in accordance with predetermined conventions. Generally speaking, the operators are designed to produce generalized implementations of mathematical operations in a manner which ensures that the operators can be chained together in any fashion to implement any analog circuit functionality.

Figure 1A:
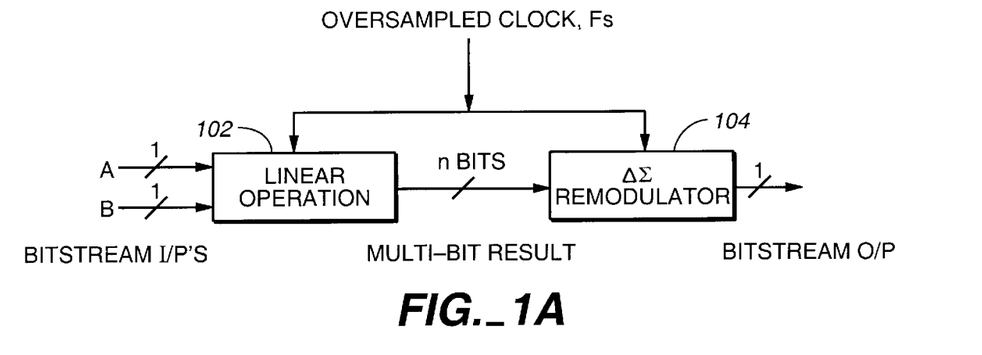
FIGS. 1A–1J illustrate exemplary operators of a library in accordance with the present invention.

As shown in FIG. 1A, the implementation of linear operators comprises at least two parts: (1) ensure closure by scaling (e.g., normalizing) at least one of a first input and an output of the operator 102 to guarantee a valid (e.g., stable and/or bounded) n bit output (where n can be greater than one); and (2) remodulating the n bit output in a delta sigma remodulator 104 to reduce the word length to a two level signal that can be represented as a bit stream in the delta sigma domain. In FIG. 1A, the first and second inputs A and B are scaled, as opposed to an output of the mathematical operation implemented by the operator 102. Linear operations are used wherever possible, recognizing that any increases in the word length which result from the linear operation will be addressed by remodulating the n bit output back to a bit stream. The remodulation function can be formed as a portion of each operator in the library, and/or can be formed as an individual operator of the library which is subsequently chained to any operator used to implement a mathematical operation.

For example, at least one input signal line of the generalized FIG. 1A operator is configured to represent an analog signal (e.g., floating point signals) of a scaled (e.g., normalized) range, such as "+1" to "−1". This convention is arbitrary, and is maintained for all processing (i.e., any range and or notation can be used). In the above example, "+1" and "−1" would be the only two values any given signal can have with, for example, a binary "0" in the bit stream being used to represent "+1" and with a binary "1" being used to represent "−1". If the two signals A and B conform to this convention, a signal resulting from the operator will be in a range of "+2" to "−2". Of course, for linear operators, the scaling can be performed on the output signal rather than the input signal. In any event, the operation 102 is normalized such that a valid result is guaranteed.

By choosing a signal scaling, and by scaling or limiting at least one of an input signal and an output signal of the mathematical operation such that the output lies within a specified range, then "closure" is assured. The assurance of closure permits a sequence of such functional operators to be randomly chained without requiring application specific scaling, and assures that the remodulator will not saturate. For some operators limiting is accomplished by the existence of a feedback loop within the application.

In configuring linear operators, care must also be taken to ensure that a delta sigma implementation of the operator or function is realizable for the intended analog operation. Further, care must be taken to ensure that the delta sigma operation is valid for all input conditions met by the analog operation.

Outputs of the mathematical operation which extend to more than one bit are remodulated to a single bit stream via the remodulator 104. As mentioned previously, operators in the library can be configured to include a remodulation function, or alternately, a separate remodulator operator can be combined with an operator used to implement a mathematical operation. Stability is ensured by clipping integrators within the remodulator and restricting signals to a fixed fraction (e.g., ±0.8) of their absolute maximum value.

A remodulator is used because a linear operation on one or more bit streams results in the word length growing from one bit to more than one bit, even when the result is rescaled to keep within the range of the original signals. For example, inputs to an addition operation (A/2+B/2) of FIG. 1B can be scaled via normalizers 106. In the exemplary FIG. 1B operator, where each of the input signals A and B can range from "−1" to "+1", the normalizers implement a scaling by 0.5.

Figure 1B:
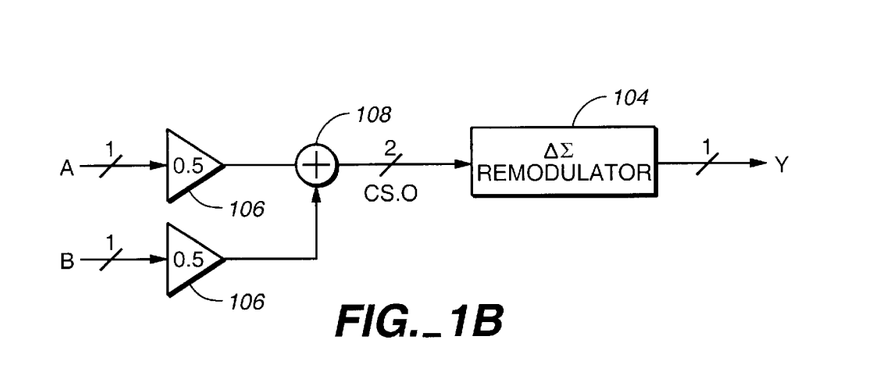

For example, assume the inputs A and B are represented as the sign bit of a "virtual" two bit notation, where "+1" is represented as a virtual two bit representation "01" and "−1" is represented as a virtual two bit representation "11", with the first bit of each two bit representation being the sign bit. As referenced herein, a "virtual two bit representation" constitutes a binary notation that can, in effect, be represented as a single bit and which is therefore appropriate for the bit stream domain.

In FIG. 1B, because only the sign bit of the two bit virtual representation changes, this single bit can be used to represent the values "+1" and "−1" provided the foregoing convention is maintained throughout all processing. Because the sign bit of the scaled virtual two bit representation is the only bit which changes state, this bit alone can be supplied from each of the normalizers 106 to an adder 108 to complete the implementation of the function (A/2+B/2).

The linear operator 108 implements the function (A/2+B/2) via use of a half adder that includes only two gates. This addition operation results in a value "CS.0" having one of three levels: "+1", "0", "−1", each of which is represented by two bits. The levels can be encoded as 01, 00, 11 respectively.

As those skilled in the art will appreciate, conventional delta sigma modulators used to accept an analog signal include a filter which possesses the full resolution of the analog signal (i.e., in essence an analog filter). In contrast, because the incoming signal to a remodulator configured in accordance with the present invention is limited to values which can be represented by a few bits of precision, the digital components needed to implement the remodulator merely include integrators (formed as accumulators) with those few bits of precision (i.e., a modest number of gates). The resultant output is a bit stream of ones and zeros whose density in this first example is equal to the (A/2+B/2).

An exemplary digital implementation of the operation (A/2+B/2) on a pair of two level signals with a half adder configured using two gates is as follows:

| Operation Performed | Binary Representation in 2's Complement Notation (with implied binary point shown in all cases) |
|---|---|
| A/2 | A.1 |
| B/2 | B.1 |
| A/2 + B12 | CS.0 | where C=A.and.B and S=A.exnor.B or in truth table form:

| A | B | CS | VALUE |
|---|---|----|-------|
| 0 | 0 | 01 | +1 |
| 1 | 0 | 00 | 0 |
| 0 | 1 | 00 | 0 |
| 1 | 1 | 11 | −1 |

It will be appreciated that because the two bit virtual representations of "+0.5" and "−0.5" each involve a fractional content of "0.1", the result of any addition of the A and B signals will contain a fractional length of zero bits. For this reason, the output of 108 in FIG. 1B is designated as a two bit value "CS.0" to reflect the absence of any fractional content. Of course, if desired, the adder can be configured to include gates to handle summed values which possess fractional contents.

Figure 1C:
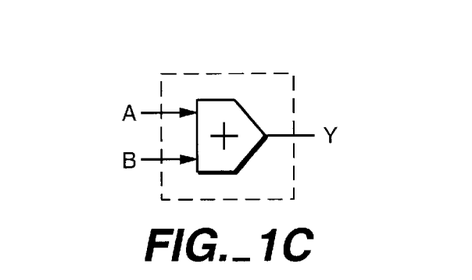

To remain in the delta sigma domain, it is necessary to remodulate the three level signal output from the addition operator back to a two level signal which can again be represented by a single bit. By using a noise shaping remodulator 104, the additional quantization noise necessary to constrain the output levels is kept out of the signal band. FIG. 1C illustrates an exemplary icon which can be used in the circuit design and fabrication system to be described later for selecting the bit stream addition operator of FIG. 1B for inclusion in a circuit layout.

Figure 1D:
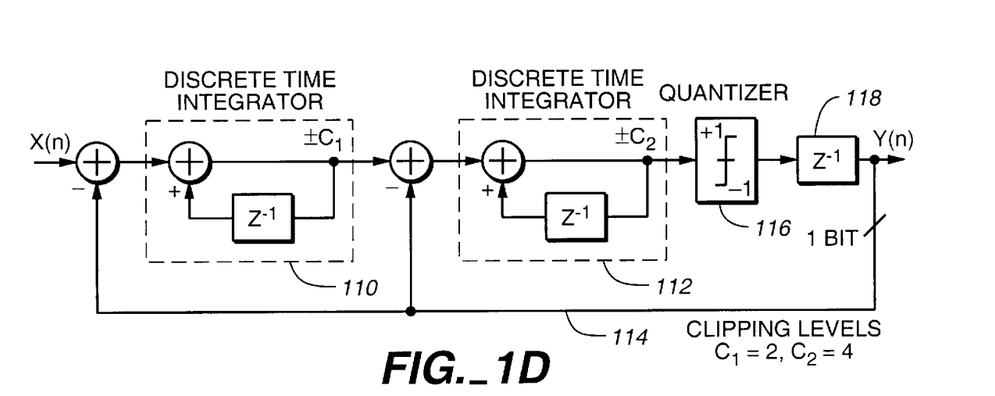

A second order remodulator to convert the output of a linear mathematical operation back to a two level signal can be implemented using the standard model of a discrete time delta sigma modulator as shown in FIG. 1D. The output of two discrete time integrators 110 and 112 (the modulator's state variables) are clipped to, for example, ±2 and ±4 respectively, since these levels do not interfere with the remodulators normal operation (below 0.8 of full span) but prevent the second order remodulator feedback loop 114 from oscillating. A quantizer 116 implemented as a threshold device produces the single bit output with values "+1" or "−1", which passes through a one unit delay 118. Of course the delay 118 can also be implemented before the quantizer 116 and combined with the second integrator which then can be shown as having a single delay in its forward path.

The fractional word length of both integrators in the remodulator depends only on the binary representation of the function's value which is input to the remodulator. In the case of (A/2+B/2), outputs take on only integer values and so no fractional extension is needed. Without fractional bits on the remodulator input, the integer part of the integrators in the remodulator of FIG. 1D can be implemented by digital accumulators of length 3 and 4 bits respectively to accommodate word length in the integrators.

In an alternate embodiment, the behavior of any operator in the library, including the remodulator, can be implemented as a logic state machine. That is, for a given input bitstream sequence, an associated bitstream output can be produced in accordance with the behavioral model of the operator's function in the delta sigma domain.

A complete function for (A/2+B/2) of the FIG. 1B half adder, including the remodulator, can for example be implemented in 130 gates. In contrast, an analog operational amplifier used to carry out the equivalent function with a similar signal-to-noise ratio would occupy a silicon area equivalent to more than 1000 gates in one micron complementary metal oxide semiconductor technology.

By developing a library of linear operators in accordance with predetermined constraints according to the present invention, guaranteed valid results can be obtained in the delta sigma domain, without returning to the analog domain or to a multibit digital signal processing domain, using robust operators. Further, because each robust operator can be guaranteed to provide valid results, a framework is established from which operators can be chained together in random fashion to implement more complex analog functions. This framework forms the basis for a circuit design and fabrication process in accordance with another aspect of the present invention.

Accordingly, a library of linear operators is created wherein outputs are bounded whenever possible. However, bounding will not work for all operators. For example, bounding will not achieve closure with respect to operators such as integrators where, if the input is present long enough, the integrator will saturate.

Further, multiplication in the time domain is the equivalent of convolution in the frequency domain. If both operands contain quantization noise, the convolution of one noise spectrum with the other will result in the noise being spread into the signal band of interest. To address this problem, one of the operands of a multiplication operator in accordance with the present invention is configured without quantization noise (i.e., a quantization noise component that is reduced relative to the other operand, the signal of reduced quantization noise being referred to herein as a "quantization-noise free signal" that is not a delta sigma signal). For example, a multiplication operation is implemented by multiplying a bit stream by a multibit value which is free of quantization noise. As those skilled in the art will appreciate, the quantization free operand can be a fixed coefficient or a dynamic variable.

Figure 1E:
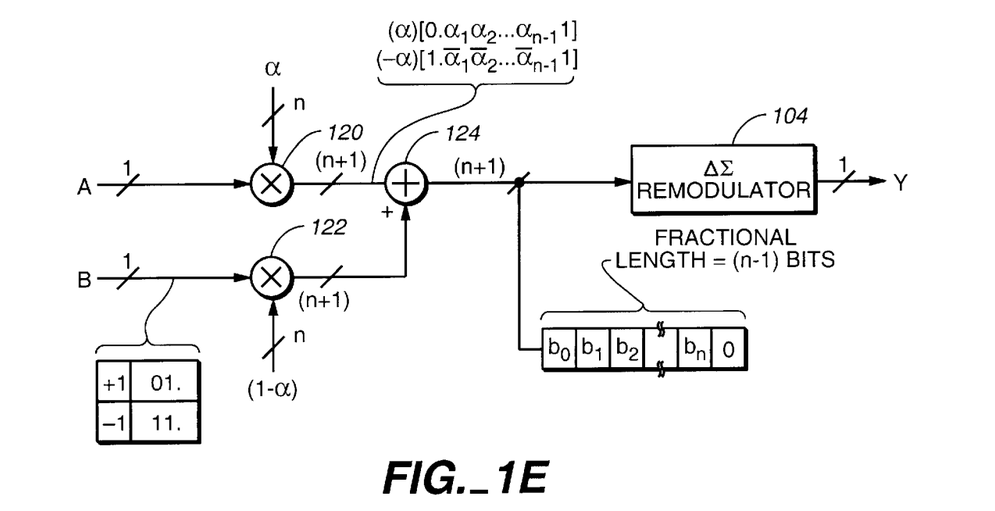

One form of multiplication is scaling, or attenuation. For example, attenuation by alpha ($\alpha$) can be implemented as: Y=A.$\alpha$+B.(1-$\alpha$) where A=signal, B='zero' value in the coding convention chosen, and $0 \leq \alpha \leq 1$. Referring to FIG. 1E, a multiplication operator for implementing attenuation, or scaling is illustrated. Here, two signal inputs conforming to the convention described previously, are supplied as inputs to the operator. These inputs are each applied to multipliers 120 and 122, respectively. The value ($\alpha$) used for scaling, which can be a variable, is expressed in a multibit form. For example, the multibit variable can be expressed as a two's complement binary fraction to n bits of precision, allowing each 1 bit multiplication operation, by A or B, to be a multiplexer which in case A switches between the coefficient ($\alpha$) or its complement (-$\alpha$). Any code format can, however, be chosen for any multibit values used in connection with any operator of the present invention (e.g., two's complement format, grey code format, and so forth).

As with the addition operator, the input signals A and B are one bit streams, wherein the sign bit of a virtual two bit representation of input values "+1" and "-1" is used for each signal. Each of these input signals is supplied to the multipliers 120 and 122, wherein they are multiplied by the coefficient $\alpha$ or (1-$\alpha$). The results from these multipliers are multibit values which, unlike the outputs of the linear addition performed in the FIG. 1B operator, include a fractional content to any resolution desired by the circuit designer.

For example, the outputs from the multipliers 120 and 122 can take on either a value of +$\alpha$ having a representation "0.$\alpha_1\alpha_2 \ldots \alpha_{n-1}$1" or -$\alpha$ represented as "1.$\overline{\alpha}_1\overline{\alpha}_2 \ldots \overline{\alpha}_{n-1}$1". Of course, in the output from the multiplier 122, the values: (1-$\alpha$) or -(1-$\alpha$) will be represented. Note that the outputs from the multipliers always result in a fractional content which ends with a trailing "1", because the precision of any word length always ends with the last "1" in that word. The inversion performed with respect to the -$\alpha$ can be implemented using exclusive OR gates.

As those skilled in the art will appreciate, only (n-1) fractional bits are required to represent the sum of the product terms such that the remodulator need only be extended (n-1) fractional bits. The outputs from the multipliers 120 and 122 are supplied to an adder 124 which produces the sum of the product terms as a multibit value within the range specified for the input signals A and B (i.e., within the range of ±1).

The remodulator 104 of the FIG. 1E operator can be configured similar to those described previously with respect to the addition operator, the only difference being that the number of gates in the remodulator of FIG. 1E must be configured consistent with the parameterized value output from the adder 124. For example, depending on the multibit fractional content of the input supplied to the remodulator of FIG. 1E, extra stages can be used to propagate the fractional bit additions, and the number of gates in each of the discrete integrators can be increased accordingly. For the two integrators of the remodulator, an exemplary 20 gates per fractional bit, in addition to the 130 gates for the integer part of the second order remodulator discussed earlier, can be used. The attenuation function is thus treated as a parameterized library module with the fractional length n as a parameter. The logic subcircuit for the fractional part of the remodulator can be automatically synthesized by a circuit design system and method according to the present invention.

An exemplary model for the foregoing function in the analog capture tool is:

$$y_{(n)}=(\alpha)a_{(n-1)}+(1-\alpha)b_{(n-1)}+e'_{(n-1)}$$

wherein lower case characters designate a sample in the time domain (versus upper case letters used for designation of processing in the frequency domain), and wherein lower case e constitutes the quantization noise model of the remodulator. The use of an exemplary model in the analog capture tool for circuit simulation will be discussed as yet another aspect of this invention after completing a discussion of an exemplary delta sigma library of operators. A similar model for the addition operator can be configured for use in the analog capture tool as follows:

$$y_{(n)}=0.5a_{(n-1)}+0.5b_{(n-1)}+e'_{(n-1)}.$$

In addition to the foregoing operators, an entire library of operators (e.g., differentiators, finite impulse response (FIR) filters, integrators, automatic gain controllers (AGC) and so forth), can be developed to implement digital signal processing functions on a bit stream in the delta sigma domain. For example, a subtraction operator can be configured in a manner similar to the addition operator described previously, with the exception that instead of implementing the function (A/2+B/2), the subtraction operator implements the function (A/2-B/2). As with the addition operator, the subtraction operator supplies an output from the mathematical function to a remodulator to ensure that an output is maintained within the delta sigma bit stream domain.

The scaling operator can be used to provide, for example, automatic gain control, or can be used as a multiplication operator that forms part of a balanced modulator. Typically, scaling will involve multiplying an input signal with a fixed value. However, as those skilled in the art will appreciate, it may be necessary in some cases to operate on an input analog signal with a nonlinear function represented for example by a polynomial expression of the input signal. As those skilled in the art will further appreciate, the multiplication of two signals, each of which contains quantization noise, results in a noise component that spreads across the signal band of interest and thereby inhibits retrieval of the original signal. Accordingly, exemplary embodiments of the present invention include an operator for accommodating a nonlinear function.

Figure 1F:
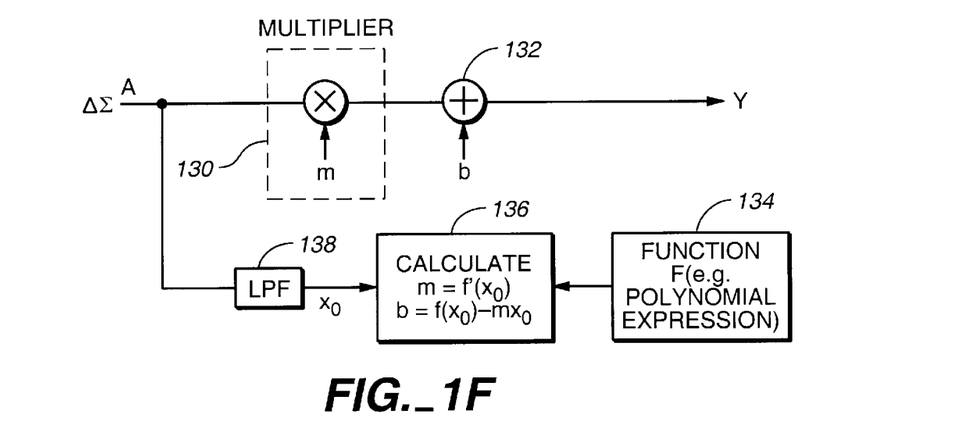

More particularly, referring to FIG. 1F, an operator with a nonlinear function F of the input signal A is illustrated. Here, the input signal A complies with the convention used with respect to the other operators of the library (eg., a bit stream value within the range ±1). The input signal A is supplied to a multiplier 130, the output of which is supplied to an adder 132. Parameters which are supplied as the multiplier operand "m" and the coefficient "b" (which is added to the output from the multiplier 130 in the adder 132) can be derived from a nonlinear function as follows.

For a given value of x (e.g., $x_0$) along the nonlinear function F, a tangential line is drawn to the function. For example, the nonlinear function may be a polynomial expression. In FIG. 1F, the nonlinear function is represented by block 134. For a given point along the x axis of this function, the equation of a line tangential to the function at that point is calculated in block 136 (i.e.: y=mx+b). To perform this calculation, the input signal A is supplied to the block 136 via a lowpass filter 138 which produces an estimate of the input signal A without the noise component.

Thus, for each point along the nonlinear function, parameters of m and b corresponding to the linear equation used to represent the tangential line to that point are calculated (for example m=f'($x_0$) and b=f($x_0$)−m$x_0$). Because the input signal A has been significantly oversampled, the nonlinear function can be considered to remain constant over a predetermined of time relative to the input signal. This enables the relatively accurate estimation of the m and b parameters. As a result, the multiplier 130 and the adder 132 are implemented as linear functions for which a valid output y can be determined. This output can then be remodulated in a manner similar to that described with respect to the attenuation operator of FIG. 1E.

A signal negation operator can be implemented by a single inverter gate to complement the bit stream. Since the word length has not grown, there is no need to remodulate an output from the negation operation. Thus, negation of a signal can be implemented with just a single gate. An exemplary model for this function in the analog capture tool is:

$$y_{(n)} = -a_{(n-1)}.$$

Note that no noise is added in this capture model since remodulation is not required. Negation of the B input stream in earlier functions is treated as a parameterized aspect.

In accordance with a library of the present invention, a comparator operator, a differentiator operator, and an integrator operator can also be configured such that their outputs remain in the delta sigma domain using a remodulator. A comparator operator such as that of FIG. 1G can, for example, be used to compare two bit streams for any desired purpose (to determine which of the two bit streams is greater). The exemplary comparator function of FIG. 1G can be analogized to an operational amplifier which, in frequency terms, behaves like a small signal integrator.

Figure 1G:
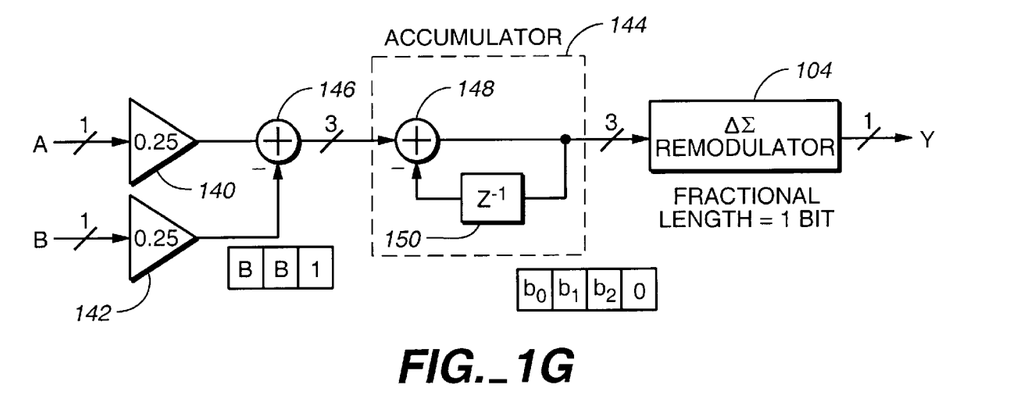

More particularly, a comparator (operational amplifier or small signal integrator) can be implemented by an extra discrete time integrator, clipped at ±1, in front of the remodulator. The presence of an integrator in the signal transfer function of the comparator is similar to the characteristics of a conventional analog operational amplifier which has been fully compensated. With the one quarter scaling of the inputs, one fractional bit is required on each integrator of the remodulator 104.

Referring to the exemplary FIG. 1G implementation, the inputs A and B are normalized via normalizers 140 and 142, respectively. By dividing the range of each of the input signals, fractional bits are created within each of the signals. Although any divisor can be used, a one quarter divisor is used in the exemplary FIG. 1G implementation to provide a buffer zone which can be relatively assured of maintaining operation of a downstream accumulator 144 in a linear range of operation. That is, the use of the one quarter divisor creates additional states between +1 and −1 to provide room for the accumulator, which functions as an up/down counter, to remain within a linear range of operation. Outputs from the normalizers 140 and 142 are supplied to an adder 146 which produces a multibit output having a two bit fractional content.

Figure 1H:
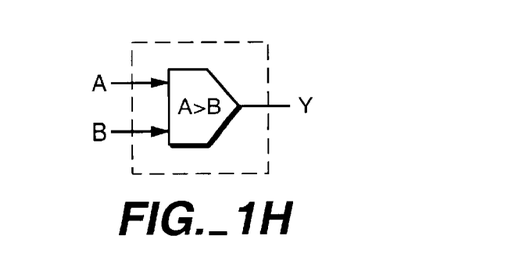

The accumulator 144 can be configured using an additional adder 148 having a positive feedback loop with a one unit delay 150. The multibit output from the adder 148 is then supplied as an input having a fractional content of one bit to the remodulator 104. An exemplary icon which can be used to represent the bit stream comparator operator of FIG. 1G is illustrated in FIG. 1H.

Figure 1I:
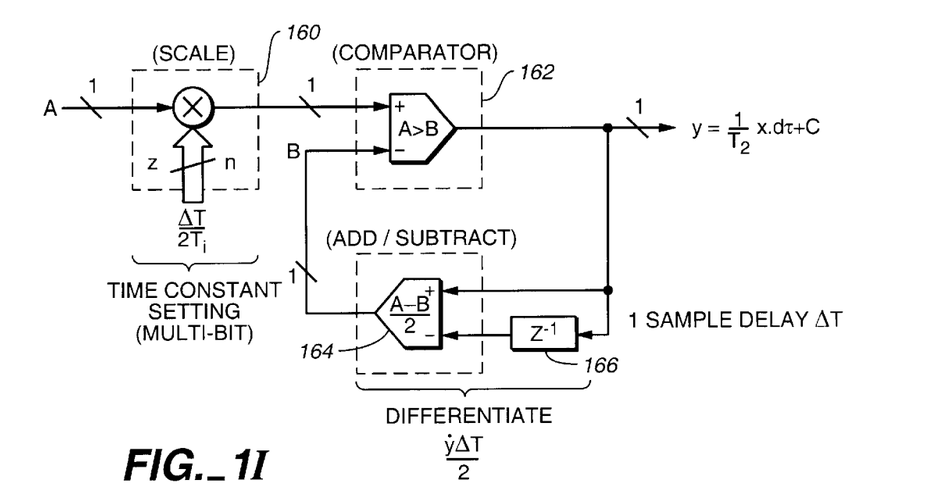

One significant use of the FIG. 1G comparator operator is to configure an integrator whose output is a bitstream. Accordingly, FIG. 1I illustrates an integration operator. Referring to FIG. 1I, an input signal A is supplied to a normalizer 160, which is used to multiply the input signal with a multibit time constant represented as $\Delta T/2T_i$. The output from the normalizer 160 is then supplied to a comparator operator which can be implemented according to the comparator operator shown in FIG. 1G.

In addition to receiving the normalized A input signal, the integrator operator also supplies a negative feedback path as the B input signal to the comparator 162. Note that the feedback path supplied to the comparator includes a subtraction operator 164, which can be configured similar to the addition operator of FIG. 1B with the exception that one of the two inputs in FIG. 1B is inverted. Further, the negative feedback loop supplied to the comparator 162 includes a one unit time delay 166. As those skilled in the art will appreciate, the combination of the subtraction operator with the output signal y and a delayed version of the output signal y implements a differentiation in the feedback path. This function is used in a negative feedback loop which maintains the value of A and B equal, such that the output value y remains bounded. As those skilled in the art will further appreciate, the inclusion of such differentiation in the feedback path to the comparator 162 results in an integration function wherein y corresponds to:

$$1/T_i \int a.dt + C$$

A model for the comparator function in the analog capture tool is:

$$y_n = y_{(n-1)} + 0.25 a_{(n-1)} - 0.25 b_{(n-1)} + e'_{(n-1)}.$$

An exemplary configuration for this function achieves scaling factors greater than unity. By using the attenuation function and making B=($\alpha$)Y, since B is forced to equal A, then Y=(1/$\alpha$)A.

A differentiator can be implemented by building upon already described operators. That is, a differentiator can be implemented, as was described with respect to the FIG. 1I integrator, by obtaining a delayed version of an input signal (e.g., a delay can be implemented as a single flip-flop) whose output is directed, along with the original input signal, to a subtraction operator. In the case of the comparator, differentiator and integrator operators, a remodulator 104 is provided at the output to ensure that operation is maintained within the delta sigma domain.

Filter operators can also be configured in accordance with exemplary embodiments of the present invention. For example, the library can be configured to include filters formed according to the biquad approach, wherein the functionality of the filter is broken down into stable components. In this regard, biquad filter operators can be configured in known fashion with the exception that a remodulator is provided at the output to ensure maintenance of operation in the delta sigma domain.

Quadrature oscillators, which are frequently used in analog circuits, can be implemented using a quadrature oscillator operator. Such operators can be implemented using known digital differential analyzer configurations, with the exception that the multibit output is supplied to a remodulator to ensure maintenance of operation in the delta sigma domain.

Because balanced modulators are frequently used in analog circuits, balanced modulator operators can also be included in the library. Such operators are often used for bandpass and single sideband applications. These operators can be configured by combining previously described operators. For example, a balanced modulator operator can be configured using the quadrature oscillator multibit output in combination with a multiplication operator. Such modulators can be used to shift an input signal within the frequency domain by converting the input signal to a complex signal using a carrier signal generator, and then using two balanced modulators to generate sine and cosine equivalents.

Decimation operators (e.g., to reduce the sampling rate) can also be configured for inclusion in the library. As those skilled in the art will appreciate, where it is desired to decimate a bit stream and maintain the result as a bit stream, increased quantization noise will result. In accordance with exemplary embodiments, a decimation operator addresses this by decreasing the bit rate of a delta sigma bit stream and increasing the order of noise shaping to further push the increased noise up in frequency. Such functionality is achieved by using a decimation filter and then resampling with a higher order remodulator (e.g., second or third order, or higher). Such decimation operators can be configured in known fashion.

Those skilled in the art will appreciate that where an off-the-shelf capture tool having a library analog operators is used, delta sigma operators can be configured in one-to-one correspondence with the analog operators of the capture tool. Alternately, those skilled in the art will appreciate that the analog capture tool can be modified to include any desired operators commonly used by the customer or engineer.

Of course, any number of operators can be included in the library. For example, more complex operators can be configured by combining one or more of the operators already described, or by adding additional operators configured in any known fashion. Other operators can be included in the library to provide common input/output functionality. For example, analog modulator operators can be included in the library, along with analog output operators, and other filter operators (e.g., $Sinc^n$ decimation filters or finite impulse response filters).

Advantages of implementing digital signal processing in the delta sigma domain include a reduction in the number of signal paths required to implement digital signal processing, and a reduction in the complexity of operators. Further, by processing in the delta sigma domain, ultimate precision can be achieved with a relatively small number of gates. For example, constructing an accurate sum and difference signal from audio stereo left and right sources to provide precise channel rejection depends upon precise weighting of the coefficients and matching of signal path delays. With analog circuits, precision is limited to the precision of the analog components used (e.g., capacitors, resistors, and so forth). By processing in the delta sigma domain, there are no approximations involved in weighting the channel coefficients, such that ideal channel rejection can be achieved.

More particularly, assuming the A and B channel signals to be 20 kHz bandwidth signals, a second order remodulator would give 2.5 bits of additional resolution for every doubling of the oversampling ratio. Thus, if the bit stream is clocked at 40 MHz, 1000 times higher than the Nyquist frequency of 40 kHz, approximately ten doublings will result in 25 bits of resolution (approximately 140 dB of SNR). Such results can be achieved with a relatively small number of gates per operator (e.g., on the order of 130 gates). Of course, exemplary embodiments are not limited to the relatively simplistic application of stereo decoding, but can be used with any application ready apparent to those skilled in the art including, but not limited to, single sideband transmission and other communications technologies which, for example, require use of balanced modulators.

Further, by processing in the delta sigma domain, an analog problem can be captured and processed in its native form. This is in contrast to conventional digital signal processing, wherein sequential processing is implemented such that any analog processing problem must be translated into a sequential program. In other words, processing in the delta sigma domain can be implemented in a parallel fashion that resembles the original analog processing to be implemented, with signal flow through the delta sigma circuit corresponding approximately one for one to signal flow through a block diagram of the analog circuit.

In accordance with another aspect of the present invention, the attributes of analog signal processing are obtained without the attendant disadvantages. For example, drift problems associated with processing small analog signals have little or no effect on circuit performance as they would in an analog circuit. Similarly, noise which would significantly affect an analog circuit has little or no effect on signal processing in accordance with the present invention.

As mentioned previously, the operators of a library in accordance with the present invention include, or are combined with, a remodulator to ensure that signal processing remains in the delta sigma domain. The increased overhead of a circuit design which results from including a plurality of remodulators is negligible given the benefits which result from maintaining signal processing in the delta sigma domain. For example, unlike conventional digital signal processing wherein word sizes can increase significantly when increased resolution is required, circuit designs configured in accordance with exemplary embodiments of the present invention maintain word lengths at one bit without sacrificing resolution. Thus, exemplary embodiments of the present invention provide for the creation of circuits that possess attributes which far exceed those of conventional digital signal processing techniques (such as PCM) and those of conventional lumped delta sigma processing techniques where delta sigma processing is merely used as an intermediate step to multibit values.

Exemplary embodiments of the present invention incur a relatively small time delay between the receipt of input signals, and the outputting of resultant signals which have been processed at any given stage of a digital signal processing cycle (i.e., a phase delay between receipt of input signals and production of a resultant output signal from a given operator). In conventional digital signal processing, this delay is relatively large due to the sequential nature of the processing and the low sample rate. However, because a relatively small delay is incurred at each stage of a circuit implemented in the delta sigma domain, applications which are constrained by real time practicalities (e.g., noise cancelers which generate anti-noise in real time for subtraction from the original signal) can be easily implemented.

That is, exemplary embodiments oversample at a high rate, with concurrent sampling paths being active in the circuit at any given time. Thus, real time problems can be easily and accurately handled since each stage of the circuit only implements a small fragment of the overall processing cycle in a parallel fashion. Therefore, multiple operators can be cascaded without producing a delay that would inhibit applicability to real time problems.

Having described a library of operators in accordance with exemplary embodiments of the present invention, the use of such a library as a framework to design and fabricate analog circuits as logic devices in the delta sigma domain will now be described. In exemplary embodiments, the library of operators are accessed, and selectively implemented on a programmable structure, such as a field programmable gate array wherein granularity is at a logic gate level. In alternate embodiments, customized application specific integrated circuits (ASICs) can be easily and quickly designed and fabricated using the library of operators. As those skilled in the art will appreciate, customized ASICs may be deemed more practical than gate array solutions where a large quantity of circuits possessing identical functionality is desired (i.e., mass production).

A design and fabrication technique in accordance with exemplary embodiments of the present invention provides significant advantages. For example, in contrast to circuit layouts implemented using analog devices for real time applications, digital ASICs can be designed and fabricated relatively quickly and cost effectively in accordance with the present invention. A fully programmable implementation (such as a gate array structure) in accordance with the present invention can be designed and programmed even more quickly (e.g., within hours), using inexperienced personnel, with a high confidence level of proper operation.

Figure 2:
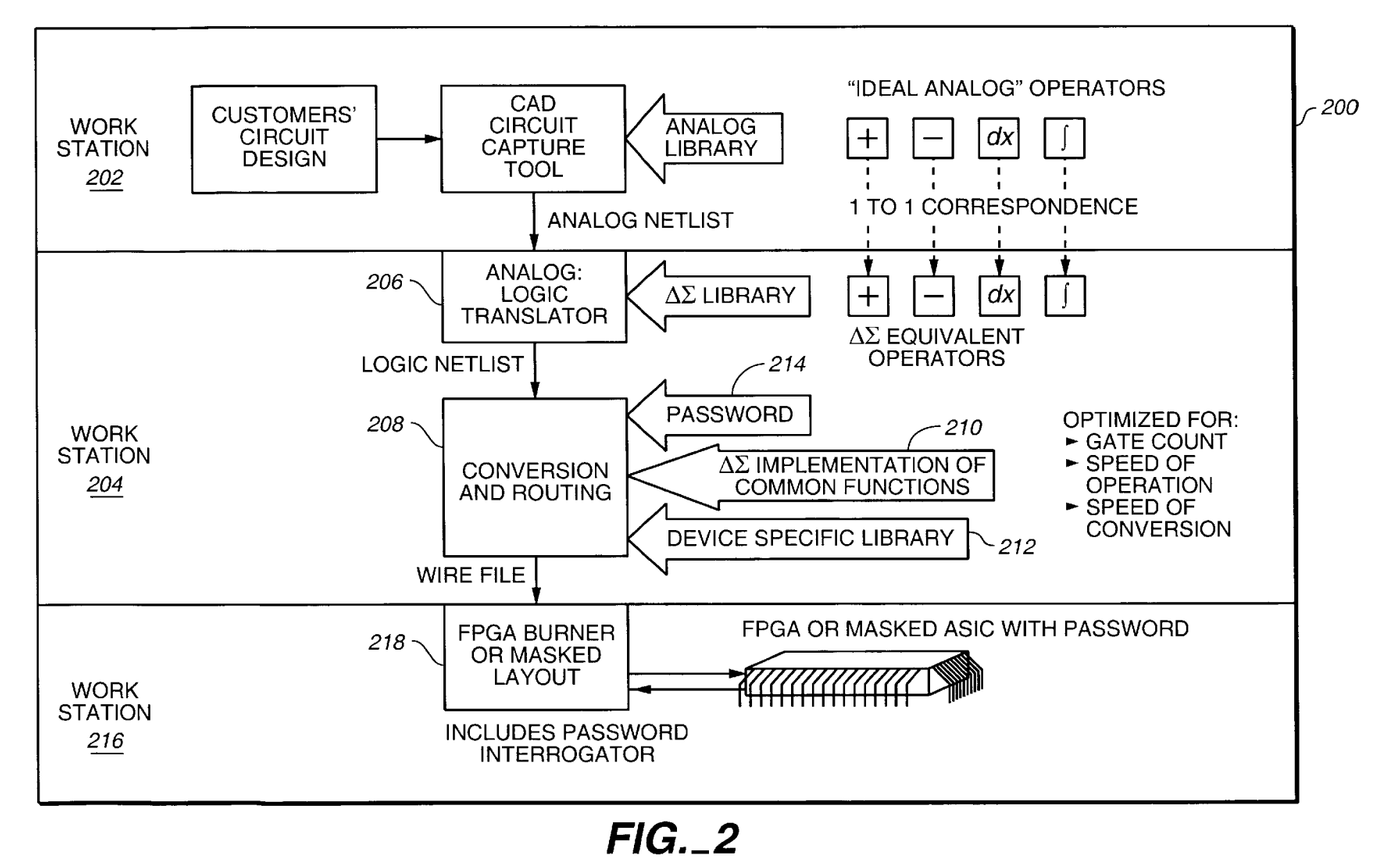
FIG. 2 illustrates a system for circuit design and fabrication in a delta sigma domain according to an exemplary embodiment of the present invention.

FIG. 2 illustrates a system 200 for producing a circuit layout used to implement signal processing in the delta sigma domain according to an exemplary embodiment of the present invention. A work station 202 of the FIG. 2 system is used to capture a behavioral model of an analog circuit (i.e., a circuit which is, at least in part, analog) as a combination of analog operators. The analog problem is therefore captured in its native form and used to produce an "analog" netlist.

One known analog domain implementation of a lowpass filter and/or highpass filter circuit is configured using three operational amplifiers and a multiplying digital-to-analog converter. More particularly, an analog input signal is supplied via an analog input to the inverting input of a differential amplifier (i.e., formed with a first operational amplifier). This first operational amplifier constitutes a voltage-controlled current source with a differential input. An output of the differential amplifier represents a reference voltage which is supplied to a multiplying digital-to-analog converter that serves as a digitally controlled current divider. Inverted and non-inverted outputs of the multiplying digital-to-analog converter are supplied to the non-inverting and inverting inputs, respectively of a second operational amplifier configured as an inverting integrator, the output of which constitutes a lowpass filter output which can be fed back to the non-inverting input of the first operational amplifier. To produce a highpass filter output, the lowpass filter output can be subtracted from the original signal using a third operational amplifier configured as a differential amplifier.

Those skilled in the art will appreciate that the stability and noise immunity of the analog circuit depends upon the matching of analog components. Further, operation depends on use of a relatively expensive multiplying digital-to-analog converter to implement a digitally programmed time constant. These drawbacks of an analog domain implementation can be overcome by configuring the circuit in the delta sigma domain using operators selected from the delta sigma library.

Figure 3:
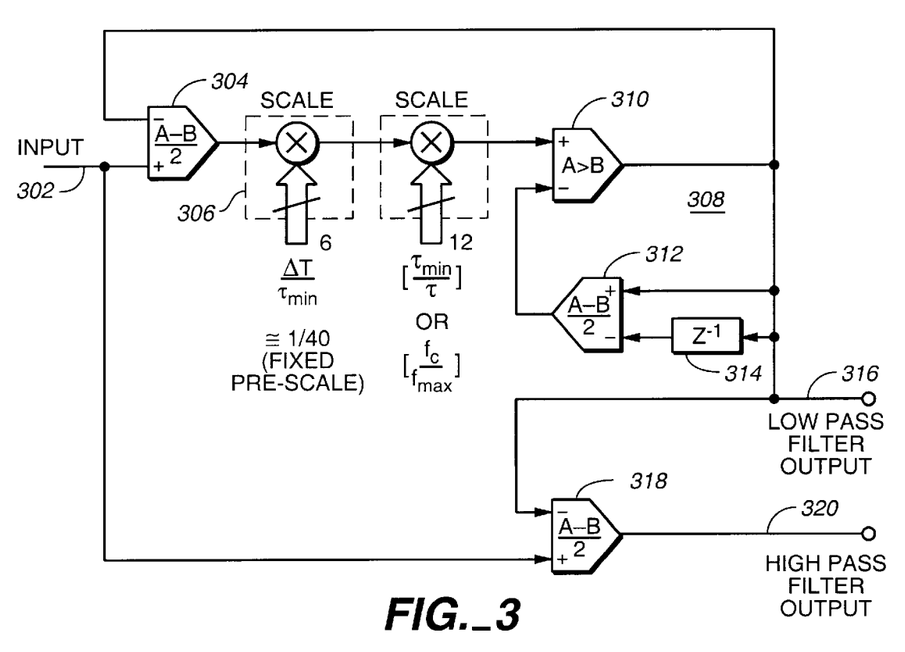
FIG. 3 is an exemplary implementation of an analog circuit using a generalized library of operators in accordance with exemplary embodiments of the present invention.

Referring to FIG. 3, an implementation of the analog circuit for the highpass and/or lowpass filter described above, in the delta sigma domain, is illustrated. More particularly, an analog input signal represented as a bitstream is supplied on input line 302 to a differential amplifier implemented in the delta sigma domain as a subtraction operator 304. An output of the subtraction operator is supplied to a scaling operator 306 for implementing a fixed prescaling with a multibit coefficient $\Delta T/\tau_{min}$ (e.g., 6 bits, or lessor or greater). For example, with a signal bandwidth of 0 to 20 kHz, $\tau_{min}=1/(2\pi f_{max})$, where $f_{max}=20$ kHz. For an exemplary bitstream rate of $f_s=5$ MHz, $\Delta T=200$ ns.

An output of the scaling operator 306 is supplied to a second scaling operator 308, where multiplication with another scaling coefficient (e.g., $\tau_{min}/\tau$ or $f_c/f_{max}$) is implemented (e.g., 12 bits, or lesser or greater). The parameter $f_c$ is the corner frequency of a programmable filter (e.g., $f_c=5$ Hz–20 kHz for the foregoing example, $f_c$ being programmable in predetermined increments of, for example, 5 Hz).

An output from the second scaling operator is supplied to an integration operator 308, formed with a comparator 310 having a negative feedback loop that includes differentiator 312 and unit delay 314. The output from the integration operator 308 constitutes the lowpass filter output 316.

A highpass filter output 320 can be implemented using another subtraction operator 318 to differentially combine the original bit stream input 302 with the lowpass filter output 316. The exemplary FIG. 3 circuit layout can be implemented with approximately 1000 gates and, even with the bit stream running at 5 MHz, can provide an acceptable signal-to-noise ratio, or dynamic range within the signal band. Of course, these characteristics can be further improved by, for example, increasing the oversampling rate and, therefore, the bitstream rate.

In accordance with the present invention, a behavioral model of the analog circuit can be captured using any readily familiar computer aided design capture tool and an attendant library of ideal analog operators. Once such capture tool is "SystemView®" available from Elanix, Inc. A capture tool, such as SystemView® can be selected which specifies the behavior of the ideal analog operators so that the tool can be used to simulate operation of the analog circuit in its native form for the signal band of interest. The capture tool produces an "analog" netlist of the ideal analog operators chosen to implement the circuit layout.

Because the behavioral model of the analog circuit will be translated to the delta sigma domain, wherein the analog signal flow characteristics of the circuit will be preserved, simulation and monitoring (e.g., frequency traces, oscilloscope monitoring and so forth) of signals using the capture tool will accurately reflect operation of the circuit layout once it is translated to the delta sigma domain. Thus, the circuit layout operation can be accurately verified at an early phase in the design process. Of course, other capture tools readily familiar to those skilled in the art can be used.

The significance of an ability to accurately simulate analog circuit operation in the analog capture tool according to exemplary embodiments of the present invention cannot be overstated. More particularly, because a generalized library of delta sigma operators are configured to operate as bounded, linear operators in the delta sigma domain, the noise component of an output of each such operator can be easily separated. Because the delta sigma operators are configured to correspond one for one with ideal analog operators in the capture tool, the capture tool library of operators are configured in accordance with exemplary embodiments of the present invention as linear functions as well. Accordingly, exemplary embodiments of the present invention include a capture tool configured with a library of ideal analog operators wherein a quantization noise component can be selectively removed from signals of interest to monitor actual analog operation, or wherein the noise can be selectively included to monitor circuit operation in the delta sigma domain. Such a feature provides a powerful simulation tool which enables accurate designs to be developed and modified before fabrication.

Figure 1J:
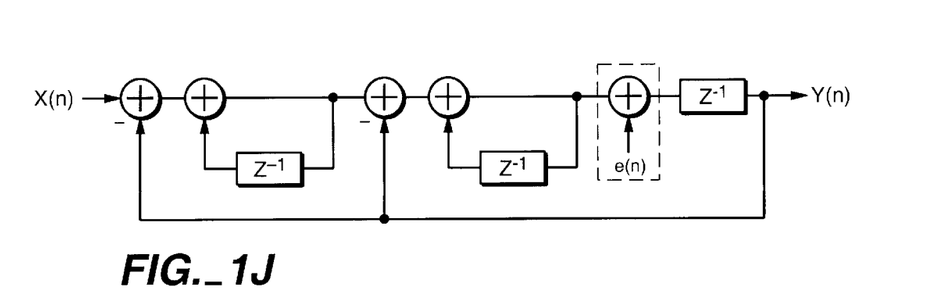

Thus, embodiments of the present invention configure the library of the analog capture device with operators that enable accurate simulation and monitoring of the analog circuit, with selective modeling of the quantization noise which will be present once the circuit is translated into the delta sigma domain. For example, the remodulator implemented in FIG. 1D can be modeled by replacing the quantizer with an additive white noise source (E), giving the linear model in FIG. 1J. This model can be used to selectively monitor the effect of quantization noise on circuit operation during an analog capture of the circuit layout. The Z transform of this model is:

$$Y(z)=X(z)z^{-1}+E(z)(1-z^{-1})^2 z^{-1}.$$

Here the signal transfer function (STF) is simply $z^{-1}$, a one sample delay. The noise transfer function (NFT) is $(1-z^{-1})^2 z^{-1}$ giving second order shaping to the noise resulting in the noise power being pushed out of the signal band.

By providing each function with a suitably shaped noise source, the library of an analog capture tool reduces to $Y(z)=X(z)z^{-1}+E'(z)z^{-1}$ where E'=2nd order noise source. In the case of the (A/2+B/2) function, the model becomes:

$$Y(z)=[0.5A(z)+0.5B(z)+E'(z)]z^{-1}$$

The $z^{-1}$ sample delay in the overall operation allows a straight forward approach to simulation of the behavior of a network of operators. Since the output of each function is based only on its previous input values, there is no contention in the case of feedback loops. For this function the iteration becomes:

$$y_{(n)}=0.5a_{(n-1)}+0.5b_{(n-1)}+e'_{(n-1)}$$

Analog models for other operators in the delta sigma library were previously set forth with the discussion of the operators.

In summary, another aspect of this invention is that using a library of the analog capture tool developed in accordance with the present invention (i.e., with an eye toward developing an equivalent set of operators in the delta sigma domain), simulation of the desired analog system can be carried out with various quantization noise options. The noise source for each function block instance is enabled as follows in one of three possible settings:

| a) | no noise | allows time domain observation of signals |
| b) | signal band noise only | allows signal-to-noise observation within the signal band |
| c) | full noise spectrum | allows power spectral density confirmation of the output of decimation filters and true analog outputs outside of the signal band. |

The sequence of samples for E' can be computed at simulation time or precalculated since they are independent of the signals of interest. In case (b), band limiting the noise involves third order filtering when, for example, the noise shaping is second order. The simulation can be taken to its logical limit by simulating the exact same structure for the remodulator as used in the final implementation. However, this limits the time domain observation unless each signal of interest is first band limited before displaying.

Having described an exemplary implementation of an analog circuit capture tool in accordance with the present invention, reference is again made to FIG. 2, and the second stage of the system 200 illustrated therein. A second stage of the FIG. 2 system 200 is represented as a work station 204 for receiving an "analog" netlist which corresponds to the analog circuit and for translating the circuit into a combination of delta sigma operators by accessing a library of delta sigma operators having one-to-one correspondence with the analog operators. The functionality of the delta sigma operators can be specified in any format desired, including but not limited to Verilog, VHDL and so forth.

The work station 204 receives the "analog" netlist from the work station 202, and accesses operators from an output (e.g., data lines) of a delta sigma library which are equivalent to the ideal analog operators. The library of delta sigma operators can be considered an implementation library of the work station 204, which includes the details necessary to configure each of the delta sigma operators as a gate level structure. Thus, a purely analog problem (i.e., the behavioral model of the analog or analog/digital circuit) is translated into a logic netlist represented using any logic level description (e.g., gate level description, VHDL description Verilog description and so forth). After translation using an analog logic translator 206 that accesses the delta sigma library, the logic netlist can be routed using a conventional routing tool 208. For example, the "Galileo Logic Explorer®" logic tool of Exemplar Logic Inc. can be used to convert a logic netlist from the analog logic translator into a routed gate level implementation suitable for fabrication on an application specific integrated circuit, a field programmable gate array, or any other logic-based implementation.

In accordance with another aspect of the present invention, operators which are determined to be used relatively frequently, can be implemented as prerouted structures and separately stored in a memory of the work station 204. As such, the speed of routing the overall circuit layout can be enhanced. The prerouted structures can, for example, be accessed from memory via path 210. Of course, common combinations of operators can also be configured as prerouted structures as well. As those skilled in the art will appreciate, the prerouted structures can be accessed where it is important to the circuit designer that the routing of each operator be optimized (e.g., in terms of speed, gate count and so forth) for a particular target implementation.

In addition to configuring common functions in the memory of the work station 204, common functions which are implemented for common target devices can also be stored in memory (e.g., in a target device specific library accessed via path 212). Thus, for a particular target device such as a field programmable gate array, commonly used operators can be accessed to reduce the effort required for conversion and routing of the logic netlist into a wire file, gate level implementation, VHDL description or other circuit layout description.

In accordance with another aspect of the present invention, the work station can be configured to include password entry in the circuit design. Such a feature can be used to inhibit unauthorized access to and/or fabrication of an analog circuit which has been translated into the delta sigma domain. In other words, entry of a valid password can be required to enable access to a fabricated circuit of delta sigma operators. For example, a password can be incorporated into the wire file for ultimate inclusion in the target device. Activation of the field programmable gate array or application specific integrated circuit is thereby inhibited unless a valid password is input to the appropriate pins of the device, with a valid password being decoded using, for example, well known decoder logic. Alternately, or in addition, password access to an unprogrammed logic device (such as a field programmable gate array) can be provided to inhibit programming of the logic device with information included in the logic netlist until a password has been entered to enable programming of the logic device.

A third stage of the system 200 produces a routed circuit layout from the combination of delta sigma operators. For example, a wire file obtained from the work station 204 can be supplied to a work station 216, wherein a tool 218 can be used to implement the wire file in a target device. In the exemplary FIG. 2 system, a target device is represented as a field programmable gate array. Using any readily available tool, such as the Galileo Logic Explorer® tool from Exemplar Logic Inc., the wire file from the work station 204 can be used to program a field programmable gate array. Alternately, those skilled in the art will appreciate that the wire file, or any other circuit layout description from the work station 204, can be used by any readily available tool to implement a logic design in a customized application specific integrated circuit.

Those skilled in the art will appreciate that exemplary systems shown in FIG. 2 can be implemented as a single device, or can be implemented as individual stations. For example, with regard to one exemplary embodiment, the work stations 202 and 216 can be configured at a user site. An "analog" netlist generated by the work station 202 can be sent, via a communications network (e.g., modem) to an off-site location wherein the wire file of the work station 204 is generated and retransmitted to the work station 218. Alternately, the delta sigma library of the work station 204 can be accessed by the work station 202 or 216 as an on-line service. Any number of alternate implementations of the FIG. 2 system 200 will be readily apparent to those skilled in the art.

Figure 4:
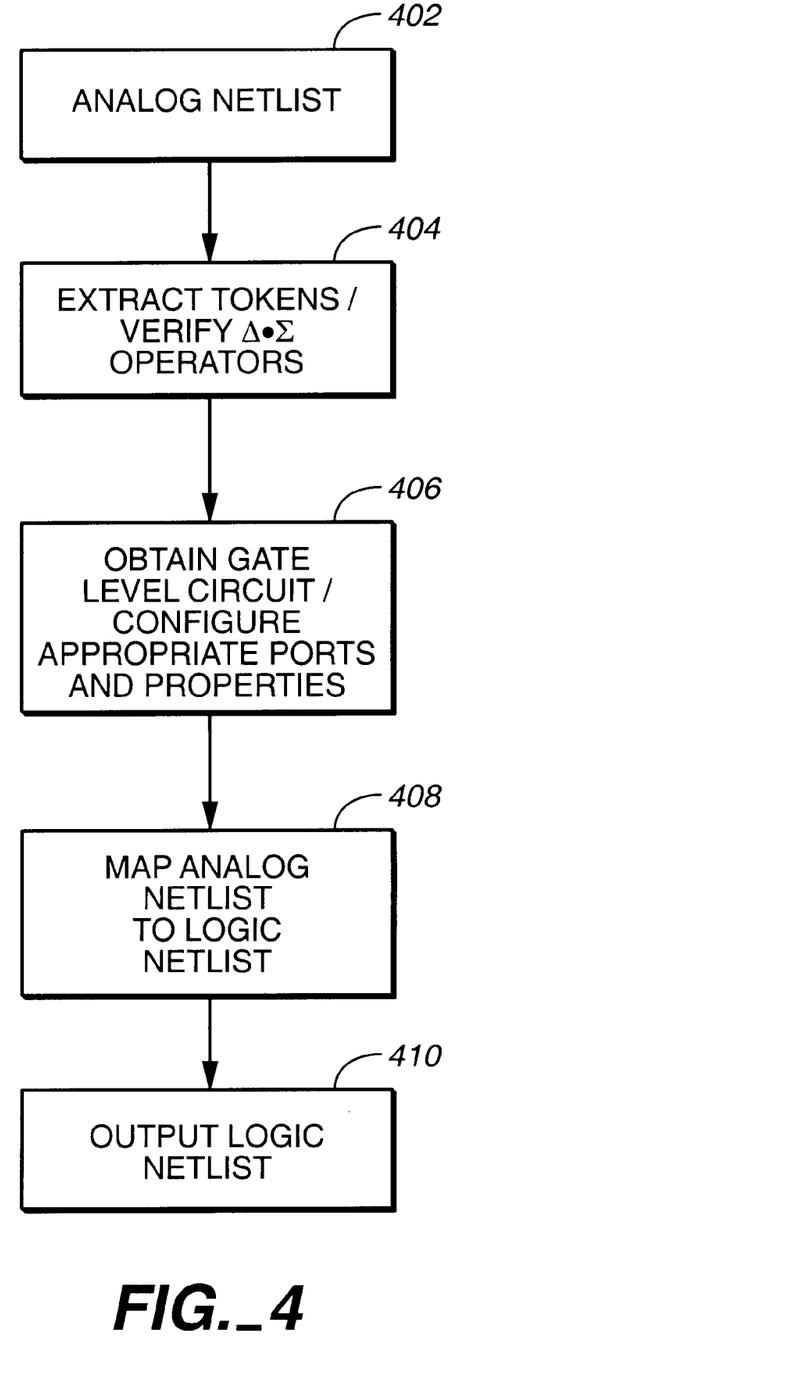
FIG. 4 illustrates an exemplary flow chart of the translator operation in the FIG. 2 system.

Having described an exemplary system, attention will now be directed FIG. 4 wherein a flowchart of the operation of the analog logic translator 206 is presented. The analog logic translator receives the "analog" netlist from the capture tool at step 402. As mentioned previously, this netlist specifies: (1) the virtual analog operators used to construct the block diagram (i.e., behavioral model) of the analog circuit; (2) the details of the inputs and outputs which are connected together for all operators; and (3) the values of any properties or parameters set by the circuit designer for each operator.

In step 404, the list of ideal analog operators are extracted, and validated against the delta sigma implementation library. That is, the analog logic translator confirms that for each ideal analog operator received, a corresponding delta sigma operator exists. If not, the circuit designer is advised so that a delta sigma operator must be configured for the given analog operator.

In step 406, for each operator received in the "analog" netlist, an operator is accessed from the delta sigma library. Each operator of the delta sigma library is represented as a logic subcircuit. Mandatory connections to the inputs and outputs of the operator are next validated. Optional ports of the operator which are used are also identified, so that appropriate functions can be included in the logic subcircuit (i.e., conditional compilation). The relevant properties for each operator are then extracted, and the logic subcircuit is expanded to accommodate such properties (i.e., again conditional compilation).

In step 408, the logic subcircuits associated with each delta sigma operator are interconnected by mapping node references from the "analog" netlist to equivalent delta sigma operators in the logic netlist produced by the analog logic translator. That is, pointers are changed to correspond with low level models.

In step 410, the logic netlist is output in any language familiar to logic designers, such as VHDL. This logic netlist can then be used to compile and simulate an analog circuit in delta sigma domain. Further, the logic netlist can be implemented as a circuit layout on a logic device, such as a field programmable gate array or application specific integrated circuit.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A computer-implemented library for implementing digital signal processing in the delta sigma domain comprising:

at least two functional operators, each of said operators having at least one of a scaled input and a scaled output for producing a valid result in the delta sigma domain, each of said at least two functional operators further including a remodulator to produce at least one bit stream output of one bit in said delta sigma domain; and an output for selectively supplying each of said at least two functional operators to an analog logic translator which correlates said at least two functional operators to an analog function.

2. A computer-implemented library according to claim 1, wherein at least one of said at least two functional operators implements in a linear function, said library further comprising:

at least one additional operator for implementing a nonlinear function.

3. A computer-implemented library according to claim 2, wherein said nonlinear function is a multiplication.

4. A computer-implemented library according to claim 3, wherein said at least one additional operator further includes:

means for calculating parameters associated with an equation of a line tangential to a point of said nonlinear function.

5. A computer-implemented library according to claim 2, wherein said linear function is integration.

6. A computer-implemented library according to claim 5, wherein said at least one functional operator for implementing said linear function of integration further includes:
- a comparator having a negative feedback path which includes a differentiator.

7. A computer-implemented library according to claim 1, wherein at least one of said at least two functional operators further includes:
- means for scaling a sign bit of an input bit stream to said at least one functional operator.

8. A computer-implemented library according to claim 1, wherein said remodulator further includes:
- at least one discrete time integrator having a parameterized fractional content 9. A computer-implemented library according to claim 1, wherein at least one of said at least two functional operators is implemented as a logic state machine.

10. A computer-implemented system for providing a linear operator for implementing an analog function in the delta sigma domain comprising:
- means for performing a mathematical operation on a first input signal and a second input signal to the operator and for scaling at least one of said first input signal and an output of the mathematical operation; and
- means for remodulating said output of the mathematical operation to maintain said output as at least one bit stream of one bit samples in the delta sigma domain.

11. The computer-implemented system according to claim 10, wherein said operator performs an addition function.

12. The computer-implemented system according to claim 10, wherein said operator performs a subtraction function.

13. The computer-implemented system according to claim 10, wherein said operator performs a comparator function.

14. The computer-implemented system according to claim 10, wherein said operator performs a linear scaling function.

15. The computer-implemented system according to claim 10, wherein said means for remodulating further includes.
- at least one discrete time integrator having a parameterized fractional content.

16. The computer-implemented system according to claim 10, wherein said analog function is a differentiation function.

17. The computer-implemented system according to claim 10, wherein said analog function is an integration function.

18. A computer-implemented system for providing a nonlinear operator for implementing an analog multiplication function on a delta sigma input to produce an output in the delta sigma domain comprising:
- means for receiving a first input signal as an operand, said first input signal being a bitstream including quantization noise;
- means for receiving a second input signal to said nonlinear operator as a multibit input with reduced quantization noise relative to said first input signal;
- means for performing an analog multiplication function on said first and second input signals; and
- means for remodulating an output of said analog multiplication function performing means to maintain said output as at least one bit stream of one bit samples in said delta signal domain.

19. The computer-implemented system according to claim 18, wherein said analog multiplication function is a scaling function.

20. The computer-implemented system according to claim 18, wherein said second input signal is derived from a nonlinear function.

21. A computer-implemented system for providing an operator for implementing an analog integration function in the delta sigma domain comprising:
- means for receiving a first input signal in the delta sigma domain as an operand, said first input signal including quantization noise; and
- means for comparing said first input signal with a second signal, said second signal being produced via a negative feedback path to a comparator which includes a differentiator.

22. A computer-implemented system according to claim 21, wherein said first input signal is a bit stream of one bit samples in the delta sigma domain, said operator further including:
- a remodulator for producing an output of said comparing means as a bit stream in the delta sigma domain.

23. A computer-implemented system according to claim 21, further including:
- means for scaling said first input signal prior to comparing said first input signal with said second signal.

* * * * *